(12) United States Patent
Chen et al.

(10) Patent No.: US 10,263,115 B2
(45) Date of Patent: Apr. 16, 2019

(54) THIN FILM TRANSISTOR AND MANUFACTURING METHOD OF THE SAME, ARRAY SUBSTRATE AND DISPLAY DEVICE

(71) Applicant: BOE TECHNOLOGY GROUP CO., LTD., Beijing (CN)

(72) Inventors: Jiangbo Chen, Beijing (CN); Youngsuk Song, Beijing (KR)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/804,016

(22) Filed: Nov. 6, 2017

(65) Prior Publication Data

US 2018/0277685 A1    Sep. 27, 2018

(30) Foreign Application Priority Data

Mar. 24, 2017 (CN) .......................... 2017 1 0184255

(51) Int. Cl.
| | |
|---|---|
| *H01L 29/786* | (2006.01) |
| *H01L 29/49* | (2006.01) |
| *H01L 21/44* | (2006.01) |
| *H01L 29/66* | (2006.01) |
| *H01L 27/12* | (2006.01) |

(52) U.S. Cl.
CPC ........ *H01L 29/78618* (2013.01); *H01L 21/44* (2013.01); *H01L 29/4908* (2013.01); *H01L 29/66969* (2013.01); *H01L 29/7869* (2013.01); *H01L 27/1225* (2013.01)

(58) Field of Classification Search
CPC ............. H01L 29/786; H01L 29/78651; H01L 29/78666; H01L 29/78675; H01L 29/4908; H01L 29/42384; H01L 27/1251; H01L 51/0541; H01L 29/66742; H01L 29/78618; H01L 51/105; H01L 21/44; H01L 21/441
See application file for complete search history.

(56) References Cited

U.S. PATENT DOCUMENTS

| | | | |
|---|---|---|---|
| 2014/0138675 A1* | 5/2014 | Yamazaki | ......... H01L 29/66757 257/43 |
| 2015/0228799 A1* | 8/2015 | Koezuka | ............... H01L 27/124 257/43 |

* cited by examiner

*Primary Examiner* — Thanhha S Pham
(74) *Attorney, Agent, or Firm* — Calfee, Halter & Griswold LLP (57) ABSTRACT

A method for manufacturing a thin film transistor includes: providing a substrate having a first surface and a second surface which are opposed to each other; forming a metal layer on the first surface of the substrate and patterning the metal layer to form a source electrode and a drain electrode; forming a semiconductor layer on the metal layer; forming a first insulating area and a gate electrode on the semiconductor layer; forming a second insulating layer on the semiconductor layer and the gate electrode; and forming a source lead and a drain lead on the second insulating layer, wherein the source lead passes through the second insulating layer and the semiconductor layer and is coupled to the source electrode, and the drain lead passes through the second insulating layer and the semiconductor layer and is coupled to the drain electrode.

6 Claims, 5 Drawing Sheets

Fig. 4 ultraviolet light

THIN FILM TRANSISTOR AND MANUFACTURING METHOD OF THE SAME, ARRAY SUBSTRATE AND DISPLAY DEVICE

CROSS-REFERENCES TO RELATED APPLICATIONS

The present application claims the priority of the Chinese patent application No. 201710184255.1, filed in China on Mar. 24, 2017, the entire disclosure of which is incorporated herein by reference.

TECHNICAL FIELD

The present disclosure relates to the field of display technology, and more specifically to a thin film transistor, a method for manufacturing the same, an array substrate having the same, and a display device having the same.

BACKGROUND

In the field of the display technology, the flat panel display device, as the mainstream of the display device, is extensively applied in various kinds of customer electronic products such as mobile phones, TV sets, personal digital assistants, digital cameras, laptops, desktop computer due to its advantages such as high image quality, low power consumption, thinness, wide application range, etc. Currently, the thin film transistor (TFT) is the major driving element in a liquid crystal display (LCD) and an active matrix organic light-emitting diode (AMOLED), which directly relates to the improvement of high-performance flat panel display devices.

The thin film transistor has various kinds of structures, and many different kinds of materials may be used to form the active layer of the thin film transistor of respective structure. Metal oxide TFT is considered as the most promising substrate technology for the improvement of the display device in larger size and higher flexibility due to their characteristics such as high field-effect mobility ($\geq 10$ cm$^2$/V·s), fast response and high transmittance in visual spectrum, etc. The metal oxide thin film transistor with a top-gate-self-aligned structure has no overlap between its source/drain electrode and its gate electrode, and thus possesses lower parasitic capacitance and better malleability, resulting in a reduction of signal delay during transmission. Additionally, the self-aligned manufacturing method may facilitate the fabrication of short channel devices and thus improve the device performance.

It is noted that, the information disclosed in this background section is merely used for the convenience of the reader to understand the background of the present disclosure, and may involve technical information in the prior art that is not well known yet to the person skilled in the art.

SUMMARY

The objective of the present disclosure is to provide a thin film transistor, a method for manufacturing the same, an array substrate having the same, and a display device having the same.

According to one aspect of the present disclosure, there is provided a method for manufacturing a thin film transistor including:

providing a substrate having a first surface and a second surface which are opposed to each other;

forming a metal layer on the first surface of the substrate and patterning the metal layer to form a source electrode and a drain electrode;

forming a semiconductor layer on the metal layer;

forming a first insulating area and a gate electrode on the semiconductor layer;

forming a second insulating layer on the semiconductor layer and the gate electrode; and forming a source lead and a drain lead on the second insulating layer, wherein the source lead passes through the second insulating layer and the semiconductor layer and is coupled to the source electrode, and the drain lead passes through the second insulating layer and the semiconductor layer and is coupled to the drain electrode.

According to one aspect of the present disclosure, there is provided a thin film transistor including:

a substrate;

a metal layer disposed on the substrate including a source electrode and a drain electrode;

a semiconductor layer disposed on the metal layer;

a first insulating area and a gate electrode disposed successively on the semiconductor layer;

a second insulating layer disposed on the semiconductor layer and the gate electrode; and a source lead and a drain lead disposed on the second insulating layer, wherein the source lead passes through the second insulating layer and the semiconductor layer and is coupled to the source electrode, and the drain lead passes through the second insulating layer and the semiconductor layer and is coupled to the drain electrode.

According to one aspect of the present disclosure, there is provided an array substrate including any thin film transistor described above.

According to one aspect of the present disclosure, there is provided a display device including any array substrate described above.

It is to be understood that both the foregoing general description and the following detailed description are exemplary and explanatory only and do not limit the disclosure.

BRIEF DESCRIPTION OF THE DRAWINGS

The drawings herein are incorporated into and constitute a part of this specification, showing embodiments consistent with the present disclosure and serving to explain the principles of the present disclosure together with the description. Apparently, the drawings described below are merely embodiments of the present disclosure and other different drawings may be obtained by those skilled in the art without departing from the inventive work.

In the drawings:
1. substrate;
2. buffer layer;
3. source electrode;
4. drain electrode;
5. semiconductor layer;
6. first insulating layer;
7. conducting layer;
8. negative photoresist layer;
9. second insulating layer;
10. second via hole;
11. first via hole;
12. drain lead;
13. source lead;
14. passivation layer;
15. first insulating area;
16. gate electrode;
A. first surface;
B. second surface.

DETAILED DESCRIPTION

The exemplary embodiments will be described more fully with reference to the accompanying drawings. However, the exemplary embodiments may be implemented in various ways and should not be considered limited to the examples set forth herein; instead, providing such embodiments enables a more complete disclosure, and thus fully conveys the concepts of the exemplary embodiments to those skilled in the art. The features, structures, or characteristics described may be combined into one or more embodiments in any suitable manner. In the following description, numerous specific details are set forth to give a full understanding of the embodiments of the present disclosure. However, those skilled in the art will appreciate that during the practice of the technical solution of the present disclosure, one or more of the particular details may be omitted or replaced by other methods, components, devices, steps etc. In other cases, customary technical means will not be described or illustrated in detail so as to prevent the various aspects of the present disclosure from being buried by the description of customary technical means.

In addition, the drawings are merely for illustrating the present disclosure and are not necessarily drawn to scale. The same reference numerals in the drawings denote the same or similar parts, and thus repeated description thereof will be omitted. Some of the block diagrams shown in the drawings are functional entities that do not necessarily correspond to physically or logically independent entities. These functional entities may be implemented in the form of software, in one or more hardware modules or integrated circuits, or in different network and/or method or devices and/or microcontrollers.

Figure 1:
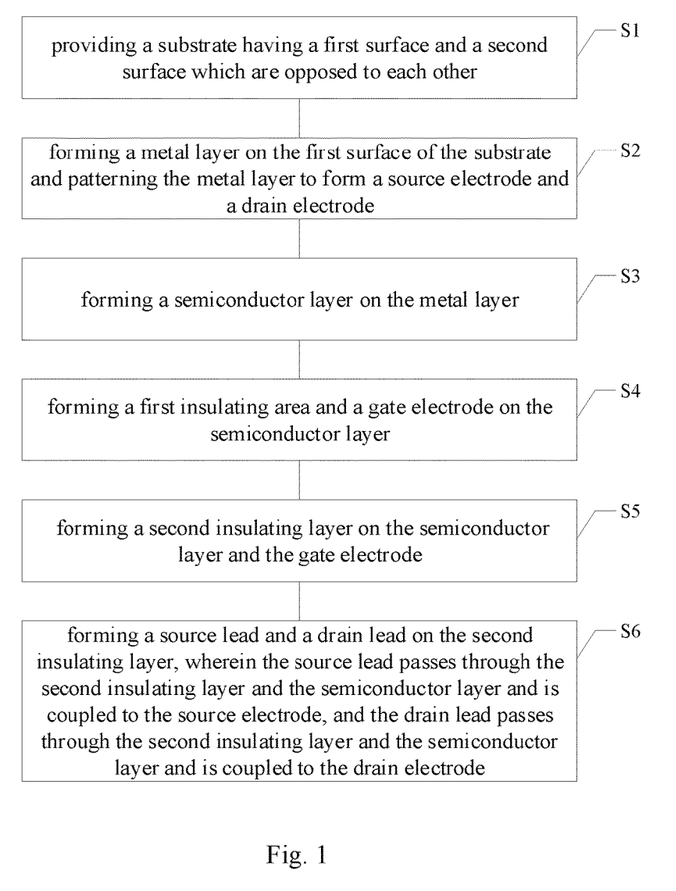
FIG. 1 schematically shows a flow chart of a method for manufacturing a thin film transistor according to an exemplary embodiment of the present disclosure.

In the present embodiment, there is provided a method for manufacturing a thin film transistor. As shown in FIG. 1, the method for manufacturing a thin film transistor includes the following steps:

Step S1: providing a substrate 1 having a first surface A and a second surface B which are opposed to each other;

Step S2: forming a metal layer on the first surface A of the substrate 1 and patterning the metal layer to form a source electrode 3 and a drain electrode 4;

Step S3: forming a semiconductor layer 5 on the metal layer;

Step S4: forming a first insulating area 15 and a gate electrode 16 on the semiconductor layer 5;

Step S5: forming a second insulating layer 9 on the semiconductor layer 5 and the gate electrode 16;

Step S6: forming a source lead 13 and a drain lead 12 on the second insulating layer 9, wherein the source lead 13 passes through the second insulating layer and the semiconductor layer and is coupled to the source electrode 3, and the drain lead 12 passes through the second insulating layer and the semiconductor layer 5 and is coupled to the drain 4.

According to the method for manufacturing a thin film transistor, the source electrode 3 and the drain electrode 4 are formed with the metal layer which can omit the conductive treatment to the semiconductor layer 5, such that the unevenness of the conductive treatment can be avoided and thus the uniformity of the electrical properties of the thin film transistor may be improved. Additionally, omitting the conductive treatment to the semiconductor layer 5 enables a relatively simple method. Moreover, the source electrode 3 and the drain electrode 4 are formed directly with metal so that the resistance of the thin film transistor can be ensured, the on-state current is increased, and thus the corresponding display device can be easily driven.

Hereinafter, the method for manufacturing a thin film transistor according to the present exemplary embodiment will be further described.

In step S1, there is provided a substrate 1 having a first surface A and a second surface B which are opposed to each other. In the present exemplary embodiment, the substrate 1 is made of a transparent glass plate.

Figure 2:
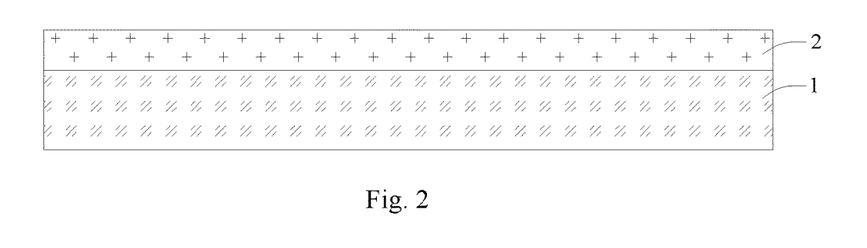
FIG. 2 schematically shows the configuration after the buffer layer is formed during the method for manufacturing a thin film transistor according to an exemplary embodiment of the present disclosure.

In the present exemplary embodiment, as shown in FIG. 2, a buffer layer 2 may be formed on the substrate 1 before forming the metal layer, and the metal layer is formed on the buffer layer 2. A buffer layer 2 having a thickness of 100 to 500 nm is formed on the substrate 1 by plasma enhanced chemical vapor deposition method. The metal layer is formed on the buffer layer. The buffer layer 2 is transparent to the light within a first wavelength range. The first wavelength range may be predetermined according to the property of the buffer layer 2, and hereinafter, may be referred to as a predetermined wavelength range. Other method of forming the buffer layer 2 may be selected as desired. The arrangement of the buffer layer 2 is optional. The buffer layer 2 may be formed on the substrate 1 as required. The buffer layer 2 may also not be formed on the substrate 1, and the metal layer may be directly formed on the substrate 1 instead. The buffer layer 2 can block the influence of the defects on the substrate 1, thereby avoiding various device defects caused by the substrate 1.

In step S2, a metal layer is formed on the first surface A of the substrate 1 and patterned to form a source electrode 3 and a drain electrode 4.

Figure 3:
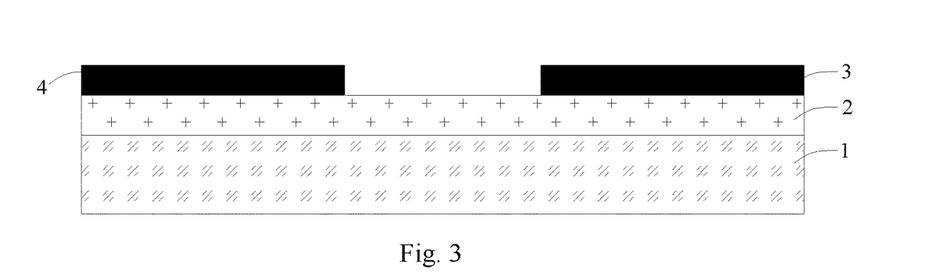
FIG. 3 schematically shows the configuration after the source electrode and the drain electrode are formed on the basis of FIG. 2 during the method for manufacturing a thin film transistor according to an exemplary embodiment of the present disclosure.

In the present exemplary embodiment, as shown in FIG. 3, a metal layer with a thickness of 50 to 400 nm may be deposited by sputtering or vapor deposition on the first surface A of the substrate 1, and a pattern which may include the source electrode 3 and the drain electrode 4 is formed by patterning the metal layer. The patterning process may generally include photoresist coating, exposure, development, etching, photoresist stripping, etc. Forming the source electrode 3 and the drain electrode 4 with the metal layer can omit the conductive treatment to the semiconductor layer 5, such that the unevenness of the conductive treatment can be avoided and thus the uniformity of the electrical properties of the thin film transistor may be improved. Additionally, omitting the conductive treatment to the semiconductor layer 5 enables a relatively simple process. The source electrode 3 and the drain electrode 4 are formed directly with metal so that the resistance of the thin film transistor can be ensured, the on-state current is increased, and thus the corresponding display device can be easily driven.

In step S3, a semiconductor layer 5 is formed on the metal layer.

In the present exemplary embodiment, the semiconductor layer 5 may include transparent oxide semiconductor, and in particular, the transparent oxide semiconductor is IGZO (indium gallium zinc oxide) which has a wide energy-gap and thus can reduce the impact of the ambient light on thin film transistors. A semiconductor layer 5 with a thickness of 10 to 100 nm may be formed on the metal layer by the plasma enhanced chemical vapor deposition method. Apparently, the method of forming the semiconductor layer 5 herein may be other methods such as sputtering, vapor deposition, coating, and the like, and it is not particularly limited herein.

In step S4, a first insulating area 15 and a gate electrode 16 are formed on the semiconductor layer 5. In the present exemplary embodiment, there is provided a variety of approaches.

Figure 4:
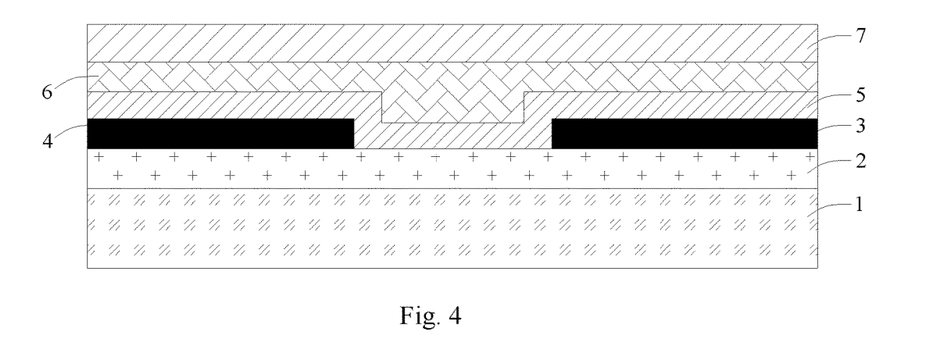
FIG. 4 schematically shows the configuration after the semiconductor layer is formed on the basis of FIG. 3 during the method for manufacturing a thin film transistor according to an exemplary embodiment of the present disclosure.

For example, as shown in FIG. 4, the first insulating layer 6 and the conducting layer 7 may be sequentially formed on the semiconductor layer 5. That is, the first insulating layer 6 is in contact with the semiconductor layer 5, and the conducting layer 7 is on the first insulating layer 6 and in contact with the same. The semiconductor layer 5, the first insulating layer 6 and the conducting layer 7 are transparent to the light within a second wavelength range, thereby providing a basic condition for the subsequent photolithography step. The second wavelength range may be predetermined according to the property of the semiconductor layer 5, the first insulating layer 6 and the conducting layer 7, and may be referred to as a predetermined wavelength range. The second wavelength range may be the same with, or different from, or partly the same with the first wavelength range. Hereinafter, in a similar manner, the term "predetermined wavelength range" may refer to the wavelength range of the light to which the corresponding layers or structures are transparent.

A first insulating layer 6 with a thickness of 100 to 500 nm may be formed by the plasma enhanced chemical vapor deposition method. The first insulating layer 6 may include SiOx. A conducting layer 7 with a thickness of 50 to 400 nm may be formed by the plasma enhanced chemical vapor deposition method. The conducting layer 7 may include a transparent conductive oxide, and in particular, the transparent conductive oxide may be ITO (Indium Tin Oxide) or IZO (Indium Zinc Oxide). ITO film is an n-type conductor material with high conductivity, high visible light transmittance, high mechanical hardness and good chemical stability. Indium zinc oxide is a transparent conductive oxide that may serve as the electrode for a light emitting device. The light within the predetermined wavelength range may be an ultraviolet light, or may be a deep ultraviolet light or an extremely deep ultraviolet light which have relatively short wavelength of 0.01 to 0.40 μm generally. Similarly, the first insulating layer 6 and the conducting layer 7 herein may be formed by other methods in the prior art, such as sputtering, vapor deposition, coating, and the like. The material of the first insulating layer 6 and the conducting layer 7 may be selected in other suitable materials as required, and that is not particularly limited herein.

Figure 5:
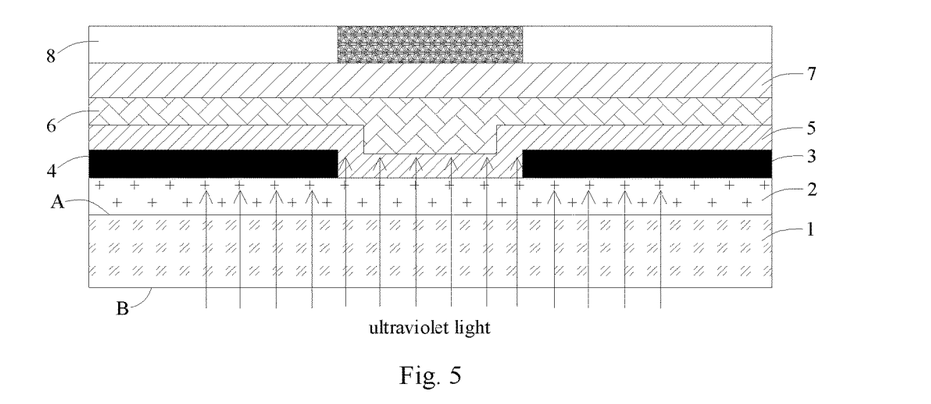
FIG. 5 schematically shows the configuration after the negative photoresist layer is formed and exposed on the basis of FIG. 4 during the method for manufacturing a thin film transistor according to an exemplary embodiment of the present disclosure.
Figure 6:
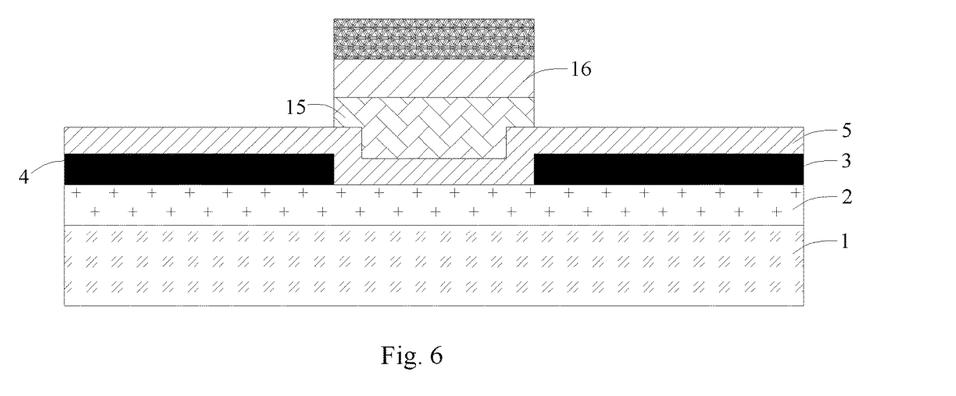
FIG. 6 schematically shows the configuration after the first insulating area and the gate electrode are formed on the basis of FIG. 5 during the method for manufacturing a thin film transistor according to an exemplary embodiment of the present disclosure.

As shown in FIG. 5, a negative photoresist layer 8 is formed on the conducting layer 7. The photoresist layer is exposed from the second surface B of the substrate 1 through the light within the predetermined wavelength range with the metal layer serving as a mask. The photoresist layer is then developed. The first insulating layer 6 and the conducting layer 7 are then etched to form the first insulating area 15 and the gate electrode 16 as shown in FIG. 6. Finally, the photoresist layer is removed.

Negative photoresist is a light-sensitive liquid mixture including photosensitive resin, sensitizer and solvent as its main composition. After the photosensitive resin is exposed to light, the photo-curing reaction takes place quickly in the exposed area, so some of the properties of the material are changed, thereby obtaining a desired pattern after the development. The gate electrode 16 is formed by wet etching the conducting layer 7 in accordance with the pattern, and then the first insulating layer 6 is subjected to dry etching according to the pattern to form the first insulating region 15. Finally implement the photoresist stripping process and other process. In addition, it will be understood by those skilled in the art that the etching to the conducting layer 7 and the first insulating layer 6 may be dry etching, and other etching methods may also be used as desired.

The photoresist layer is exposed from the second surface B of the substrate 1 with the source 3 and the drain 4 formed by the metal layer serving as a mask, and then the photoresist layer is developed to form a protective film so as to provide a basis condition for the subsequent etching process. The conducting layer 7 and the first insulating layer 6 are then etched successively. The one lithography process provides a protective film for two etching steps, so that the number of the steps is reduced and the number of the use of the mask is reduced, which cause a relatively simple manufacturing process.

As another example, forming a first insulating area 15 and a gate electrode 16 on the semiconductor layer 5 may include the following.

A first insulating layer 6 may be formed on the semiconductor layer 5. The semiconductor layer 5 and the first insulating layer 6 are transparent to the light within a predetermined wavelength range. A negative photoresist layer 8 may be formed on the first insulating layer 6. The photoresist layer is exposed from the second surface B of the substrate 1 through the light within the predetermined wavelength range with the metal layer serving as a mask. The photoresist layer is developed. The first insulating layer 6 is etched to form the first insulating area 15. The photoresist layer is removed.

A conducting layer 7 may be formed on the semiconductor layer 5 and the first insulating area 15, and the semiconductor layer 5, the first insulating area 15 and the conducting layer 7 are transparent to the light within a predetermined wavelength range. A negative photoresist layer 8 may be formed on the conducting layer 7. The photoresist layer is exposed from the second surface B of the substrate 1 through the light within the predetermined wavelength range with the metal layer serving as a mask. The photoresist layer is developed. The conducting layer 7 is etched to form the gate electrode 16 The photoresist layer is removed.

The description of the main technical features has been specifically described in the first embodiment and will not be described herein. The present exemplary embodiment differs from the above-described exemplary embodiment mainly in that: forming the first insulating layer 6 firstly and etching the same to form the first insulating area 15; and then forming the conducting layer 7 and etching the same to form the gate electrode 16. The source electrode 3 and the drain electrode 4 formed by the metal layer serves as a mask during the two etching processes, which reduces the use of the mask, thereby reducing the operation steps and making the process simple.

Figure 7:
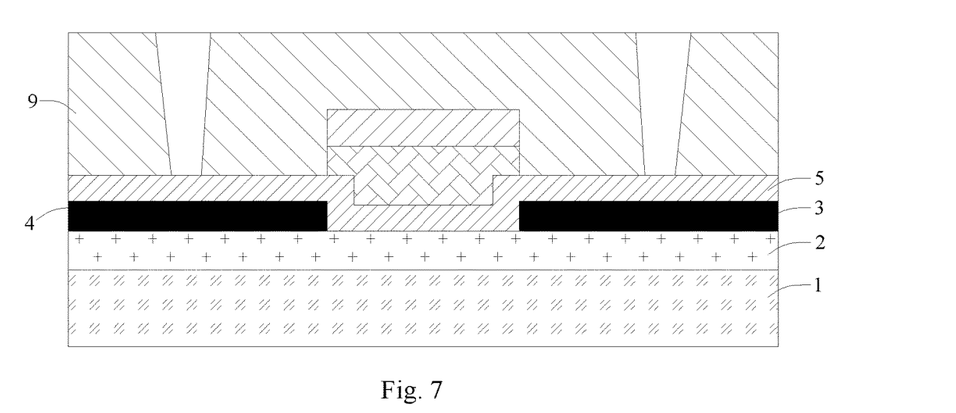
FIG. 7 schematically shows the configuration after the second insulating layer and its first via hole and second via hole are formed on the basis of FIG. 6 during the method for manufacturing a thin film transistor according to an exemplary embodiment of the present disclosure.

In step S5, as shown in FIG. 7, a second insulating layer 9 is formed on the semiconductor layer 5 and the gate electrode 16. In the present exemplary embodiment, the second insulating layer 9 with a thickness of 100 to 500 nm may be formed by the plasma enhanced chemical vapor deposition method. The second insulating layer 9 may include SiOx and the like. The second insulating layer 9 may be formed by other methods in the prior art, such as sputtering, vapor deposition, coating, and the like, and that is not particularly limited herein.

In Step S6, a source lead 13 and a drain lead 12 are formed on the second insulating layer 9, wherein the source lead 13 passes through the second insulating layer and the semiconductor layer 5 and is coupled to the source electrode 3, and the drain lead 12 passes through the second insulating layer 9 and the semiconductor layer 5 and is coupled to the drain 4.

Figure 8:
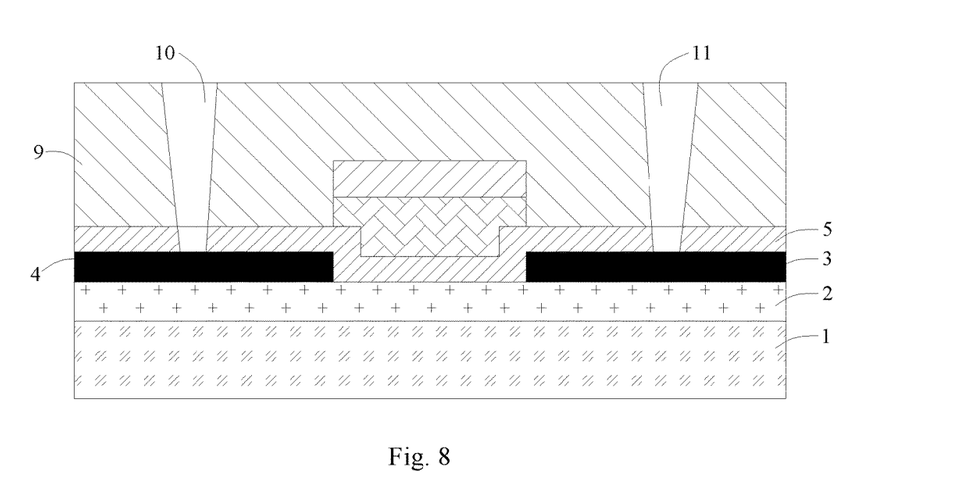
FIG. 8 schematically shows the configuration after the first via hole and the second via hole pass through the semiconductor on the basis of FIG. 7 during the method for manufacturing a thin film transistor according to an exemplary embodiment of the present disclosure.
Figure 9:
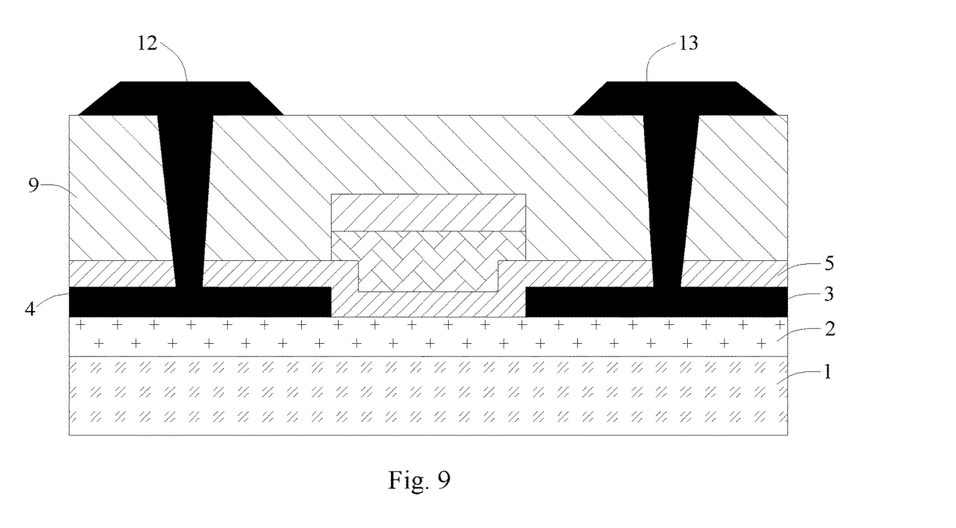
FIG. 9 schematically shows the configuration after the source lead and the drain lead are formed on the basis of FIG. 8 during the method for manufacturing a thin film transistor according to an exemplary embodiment of the present disclosure.

In the present exemplary embodiment, as shown in FIG. 8, a pattern includes the first via hole 10 and the second via hole 11 may be formed by dry etching the second insulating layer 9, and then the semiconductor layer 5 is etched such that the first via hole 11 and the second via hole 10 are communicated with the source electrode 3 and the drain electrode 4 correspondingly. A lead layer having a thickness of 50 to 400 nm may be formed on the second insulating layer 9 by sputtering, and the lead layer extends into the first via hole 10 and the second via hole 11 and is coupled to the corresponding source electrode 3 and drain electrode 4 respectively. The lead layer then may undergo a lithography and etching process to form a pattern including the source lead 13 and the drain lead 12 with the source lead 13 and the drain lead 12 coupled to the source electrode 3 and the drain electrode 4 respectively, as shown in FIG. 9. It will be understood by those skilled in the art that the method of etching the second insulating layer 9 and the lead layer may be selected from the prior art as desired, and that is not particularly limited herein.

Figure 10:
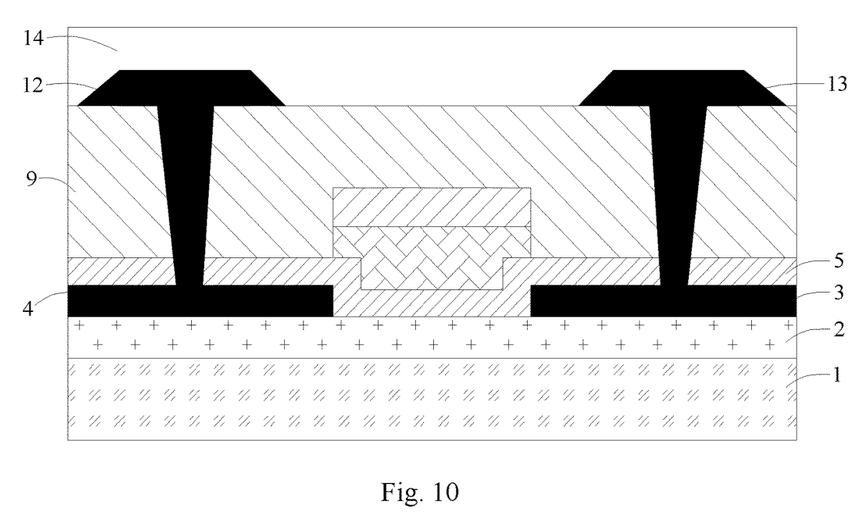
FIG. 10 schematically shows the configuration after the passivation layer is formed on the basis of FIG. 9 during the method for manufacturing a thin film transistor according to an exemplary embodiment of the present disclosure.

Further, as shown in FIG. 10, the method for manufacturing a thin film transistor may also include: forming a passivation layer 14 on the second insulating layer 9, the source lead 13, and the drain lead 12 after forming the source lead 13 and the drain lead 12. A passivation layer 14 having a thickness of 200 to 400 nm may be formed by the plasma enhanced chemical vapor deposition method on the second insulating layer 9, the source lead 13, and the drain lead 12. The method for forming the passivation layer 14 may be other existing method in the prior art. The arrangement of the passivation layer 14 is optional. The passivation layer 14 may be formed on the second insulating layer 9, the source lead 13, and the drain lead 12 as required. The passivation layer 14 may also not be formed on the second insulating layer 9, the source lead 13 and the drain lead 12. The passivation layer 14 is capable of protecting the source lead 13 and the drain lead 12. The passivation layer 14 may include SiOx, SiNx or the like.

In addition, although the steps of the method of the present disclosure have been described in a specific order in the drawings, it is not intended or implied that the steps must be performed in that particular order or the steps shown must be performed completely in order to achieve the expected result. Additionally or optionally, some steps may be omitted, multiple steps may be combined into one step, and/or a step may be decomposed into multiple steps.

Further, the present exemplary embodiment also provides a thin film transistor formed through the above-described method for manufacturing a thin film transistor. As shown in FIG. 10, the thin film transistor may include a substrate 1, a metal layer, a semiconductor layer 5, a first insulating area 15, a gate electrode 16, a second insulating layer 9, a source lead 13, and a drain lead 12.

Specifically, the metal layer is provided on the substrate 1, and the metal layer may include a source electrode 3 and a drain electrode 4 with a channel area between the source electrode 3 and the drain electrode 4. The semiconductor layer 5 is disposed on the metal layer. The first insulating area 15 and the gate electrode 16 are disposed on the semiconductor layer 5 successively. That is, the first insulating area 15 is disposed on the semiconductor layer 5 and the gate electrode 16 is disposed on the first insulating area 15. The first insulating area 15 and the gate electrode 16 are both disposed on the channel between the source electrode 3 and the drain electrode 4. The second insulating layer 9 is disposed on the semiconductor layer 5 and the gate electrode 16. The second insulating layer 9 is provided with a first via hole 10 and the a second via hole 11. Both of the first via hole 10 and the a second via hole 11 pass through the second insulating layer 9 and the semiconductor layer 5 and are communicated with the source electrode 3 and the drain electrode 4. The source lead 13 and the drain lead 12 are disposed on the second insulating layer 9. The source lead 13 passes through the second insulating layer and the semiconductor layer 5 through the first via hole 11 and is coupled to the source electrode 3. The drain lead 12 passes through the second insulating layer 9 and the semiconductor layer 5 through the second via hole 10 and is coupled to the drain electrode 4.

The structure of the thin film transistor illustrated in the present exemplary embodiment may have various sequences (for example, a plurality of insulating layers may be provided, etc.) as long as the thin film transistor is fabricated to have necessary elements for driving, such as a gate electrode 16, a source electrode 3, a drain electrode 4, and the like, and to have conductive elements (such as coupling electrodes made of ITO material) for coupling various signal lines to the external with each of the insulating layers insulated from each other.

Further, the semiconductor layer 5 may include a transparent oxide semiconductor. The gate electrode 16 may include transparent conductive oxide.

Further, the thin film transistor may further include a buffer layer 2 which may be disposed on the substrate 1. The source electrode 3 and the drain electrode 4 may be disposed on the buffer layer 2.

Further, the thin film transistor may further include a passivation layer 14 which may be disposed on the second insulating layer 9, the source lead 13 and the drain lead 12.

The specific details of the respective film layers in the above-described thin film transistor have been described in detail in the specification of the corresponding manufacturing method, and therefore, they will not be described here.

The embodiments of the present disclosure also provide an array substrate which may include R pixels, B pixels, G pixels, pixel electrodes and the above thin film transistors, and may also include gate lines, signal lines and the like.

The embodiments of the present disclosure also provide a display device which may include the above-described array substrate. The display device may be any product or component having a display function, such as a liquid crystal display device, an electronic paper, an OLED display device, a mobile phone, a tablet computer, a television set, a monitor, a notebook computer, a digital photo frame, a navigator and the like.

In the method for manufacturing a thin film transistor according to the present disclosure, a metal layer is formed on the substrate and then patterned to form a source electrode and a drain electrode, then a semiconductor layer, a first insulating area, a gate electrode, a second insulating layer are formed on the metal layer successively, and finally on the second insulating layer a source lead and a drain lead are formed which pass through the second insulating layer and the semiconductor layer to be coupled to the source electrode and the drain electrode respectively. In one aspect, forming the source electrode and the drain electrode with the metal layer can omit the conductive treatment to the semiconductor layer, such that the unevenness of the conductive treatment can be avoided and thus the uniformity of the electrical properties of the thin film transistor may be improved. In another aspect, omitting the conductive treatment to the semiconductor layer 5 enables a relatively simple process. In yet another aspect, the source electrode and the drain electrode are formed directly with metal so that the resistance of the thin film transistor can be ensured, the on-state current is increased, and thus the corresponding display device can be easily driven.

Other embodiments of the present disclosure will be readily apparent to those skilled in the art upon consideration of the specification and practice of the invention disclosed herein. The present application is intended to cover any variations, uses or adaptations of the present disclosure that follow the general principles of the present disclosure and include the common knowledge or conventional techniques disclosed in this disclosure. The specification and embodiments are to be regarded as illustrative only, and the true scope and spirit of the disclosure is indicated by the appended claims.

What is claimed is:

1. A method for manufacturing a thin film transistor comprising:
    providing a substrate having a first surface and a second surface which are opposed to each other;
    forming a metal layer on the first surface of the substrate and patterning the metal layer to form a source electrode and a drain electrode;
    forming a semiconductor layer on the metal layer;
    forming a first insulating area and a gate electrode on the semiconductor layer;
    forming a second insulating layer on the semiconductor layer and the gate electrode; and
    forming a source lead and a drain lead on the second insulating layer, wherein the source lead passes through the second insulating layer and the semiconductor layer and is coupled to the source electrode, and the drain lead passes through the second insulating layer and the semiconductor layer and is coupled to the drain electrode,
    wherein the step of forming a first insulating area and a gate electrode on the semiconductor layer comprises:
    forming a first insulating layer and a conducting layer successively on the semiconductor layer, wherein the semiconductor layer, the first insulating layer and the conducting layer are transparent to light within a first wavelength range;
    forming a negative photoresist layer on the conducting layer;
    exposing the photoresist layer from the second surface of the substrate through the light within the first wavelength range with the metal layer serving as a mask;
    developing the photoresist layer;
    etching the first insulating layer and the conducting layer to form the first insulating area and the gate electrode; and
    removing the photoresist layer,
    or
    wherein the step of forming a first insulating area and a gate electrode on the semiconductor layer comprises:
    forming a first insulating layer on the semiconductor layer, wherein the semiconductor layer and the first insulating layer are transparent to light within a first wavelength range;
    forming a negative photoresist layer on the first insulating layer;
    exposing the photoresist layer from the second surface of the substrate through the light within the first wavelength range with the metal layer serving as a mask;
    developing the photoresist layer;
    etching the first insulating layer to form the first insulating area;
    removing the photoresist layer; and
    forming the gate electrode on the first insulating area,
    or
    wherein the step of forming a first insulating area and a gate electrode on the semiconductor layer comprises:
    forming the first insulating area on the semiconductor layer;
    forming a conducting layer on the semiconductor layer and the first insulating area, wherein the semiconductor layer, the first insulating area and the conducting layer are transparent to light within a first wavelength range;
    forming a negative photoresist layer on the conducting layer;
    exposing the photoresist layer from the second surface of the substrate through the light within the first wavelength range with the metal layer serving as a mask;
    developing the photoresist layer;
    etching the conducting layer to form the gate electrode; and
    removing the photoresist layer.

2. The method for manufacturing a thin film transistor of claim 1, wherein the step of forming a first insulating area and a gate electrode on the semiconductor layer comprises:

forming the first insulating area on the semiconductor layer;

forming the conducting layer on the semiconductor layer and the first insulating area, wherein the semiconductor layer, the first insulating area and the conducting layer are transparent to light within the first wavelength range;

forming the negative photoresist layer on the conducting layer;

exposing the photoresist layer from the second surface of the substrate through the light within the first wavelength range with the metal layer serving as the mask;

developing the photoresist layer;

etching the conducting layer to form the gate electrode; and removing the photoresist layer.

3. The method for manufacturing a thin film transistor of claim 1, wherein the semiconductor layer comprises transparent oxide semiconductor.

4. The method for manufacturing a thin film transistor of claim 1, wherein the gate electrode comprises transparent conductive oxide.

5. The method for manufacturing a thin film transistor of claim 1 further comprises:

forming a buffer layer on the substrate before forming the metal layer, and forming the metal layer on the buffer layer.

6. The method for manufacturing a thin film transistor of claim 1 further comprises:

forming a passivation layer on the second insulating layer, the source lead and the drain lead after forming the source lead and the drain lead.

* * * * *